United States Patent [19]
Wei

[11] Patent Number: 5,838,544
[45] Date of Patent: Nov. 17, 1998

[54] HEAT DISSIPATING STRUCTURE FOR RECTIFIERS OF CAR ALTERNATORS

[75] Inventor: Chen-Ku Wei, Nan-Tou, Taiwan

[73] Assignee: Mobiletron Electronics Co., Ltd., Taichung, Taiwan

[21] Appl. No.: 855,171

[22] Filed: May 13, 1997

[51] Int. Cl.⁶ ..................................................... H05K 7/20
[52] U.S. Cl. ......................... 361/704; 361/717; 361/718; 361/719; 363/145; 310/68 D
[58] Field of Search ................................... 361/704, 717, 361/718, 719; 363/145; 310/68 D

*Primary Examiner*—Gerald P. Tolin
*Assistant Examiner*—Boris L. Chervinsky
*Attorney, Agent, or Firm*—Rosenberg, Klein & Bilker

[57] ABSTRACT

A heat dissipating structure for rectifiers of car alternators includes an upper cover, a rectifier assembly disposed under the upper cover, and a heat dissipating plate disposed below the rectifier assembly. The rectifier assembly is comprised of a plurality of rectifying elements and terminals, and a heat conductive assembly for receiving the rectifying elements. One side of the respective rectifying elements are connected to the terminals to constitute a rectifier circuit. The other side of the respective rectifying elements are connected to the heat conductive assembly, which is in turn connected to the heat dissipating plate. The heat conductive assembly is comprised of a heat conductive plate to which the rectifying elements may adhere, and a ceramic heat dissipating substrate disposed between the heat conductive plate and the heat dissipating plate. The ceramic heat dissipating substrate may efficiently dissipate heat and is compact in size, so that the overall size and weight of the heat dissipating structure may be reduced in size and weight.

3 Claims, 4 Drawing Sheets

HEAT DISSIPATING STRUCTURE FOR RECTIFIERS OF CAR ALTERNATORS

BACKGROUND OF THE INVENTION

1. Field of the Invention

This invention relates generally to an improved heat dissipation structure for rectifiers of car alternators, and more particularly to a structure that may reduce the size and weight of heat dissipating materials consumed by the rectifier and achieve effective heat dissipation.

2. Description of the Prior Art

Cars' electricity supply depends upon their alternators as well as their batteries. Electric power generated by the alternator may be accumulated in the battery so that the battery will not easily run out of electric power. If the alternator cannot generate sufficient electric power, the car may run out of electricity. The electricity generating effects of the alternator cannot therefore be overlooked.

As alternators generate alternating currents, they must be rectified into direct currents before they can be used by the car and the battery. Therefore, a bridge type rectifier circuit is disposed at an output of the alternator. However, since there is extremely high working temperature around the car engine, the electronic structure of the rectifier will be affected by high temperature so that the electricity generating and rectifying effects are lowered. Besides, after the rectifying circuit has worked for a period of time, its internal temperature will also rise, so that power supply is abnormal. Therefore, alternators must be equipped with heat dissipation structures to ensure their normal operation.

FIG. 1 shows a conventional heat dissipation structure for car alternators. It essentially comprises an upper cover 100 covering a rectifier assembly 400 disposed on a heat dissipating plate 300. The rectifier assembly 400 is comprised of a plurality of rectifying elements 401, 402, 403, . . . , a plurality of terminals 411, 412, 413, . . . , and a dissipating drum 420 for receiving the rectifying elements. The rectifying elements are generally rectifying diodes, having one side in contact with the terminals. The respective terminals pass have a portion passing through the upper cover 100. The upper cover 100 has a rectifier circuit formed by electrically conductive lapping plates 101. The heat dissipating drum 420 is a thermally conductive metal housing. A pad 421 is disposed below the heat dissipating drum 420, and the heat dissipating plate 300 is provided below the pad 421. In this way, the heat generated by the rectifying elements during work or the ambient heat may pass from the dissipating drum 420 through the pad 421 to the peripheral walls of the heat dissipating plate 300, and to the atmosphere. In this structure, however excellent the heat dissipation effects of the specially selected metal material of the dissipating drum 420 are, the dissipating drum 420 has to cover a large area in order to absorb all the heat. A large-size dissipating drum will be very bulky and space-occupying, and will be very inconvenient to install. Besides, it will increase the weight of the alternator and hence the weight of the car, which will result in greater consumption of power. In addition, the the pad 421 will not be able to transmit the heat, and a cooling fan will become necessary, which is not advantageous to the alternator itself.

SUMMARY OF THE INVENTION

This invention relates generally to an improved heat dissipation structure for rectifiers of car alternators, and more particularly to a structure that may reduce the size and weight of heat dissipating materials consumed by the rectifier and achieve effective heat dissipation.

It is a primary object of the present invention to provide an improved heat dissipating structure for rectifiers of car alternators, in which rectifying elements are connected to a heat conductive assembly, the heat conductive assembly comprising a heat conductive plate to which the rectifying elements may adhere, and a ceramic heat dissipating substrate disposed between the heat conductive plate and a heat dissipating plate. The ceramic heat dissipating substrate is itself a good heat conductor which may quickly distribute heat to the heat dissipating plate which is made of copper. The heat dissipating plate in turn dissipates the heat to the housing of the alternator. Compared to the prior art, the heat dissipating structure of the invention is compact in size and light in weight. Besides, heat dissipating effects is excellent, and assembly easy. There is no need to provide any cooling fans, and the engine power consumption may be reduced.

BRIEF DESCRIPTION OF THE DRAWINGS

The invention is further described hereafter, by way of example only, with reference to the accompanying drawings, in which.

DETAILED DESCRIPTION OF THE PREFERRED EMBODIMENT

Figure 1:
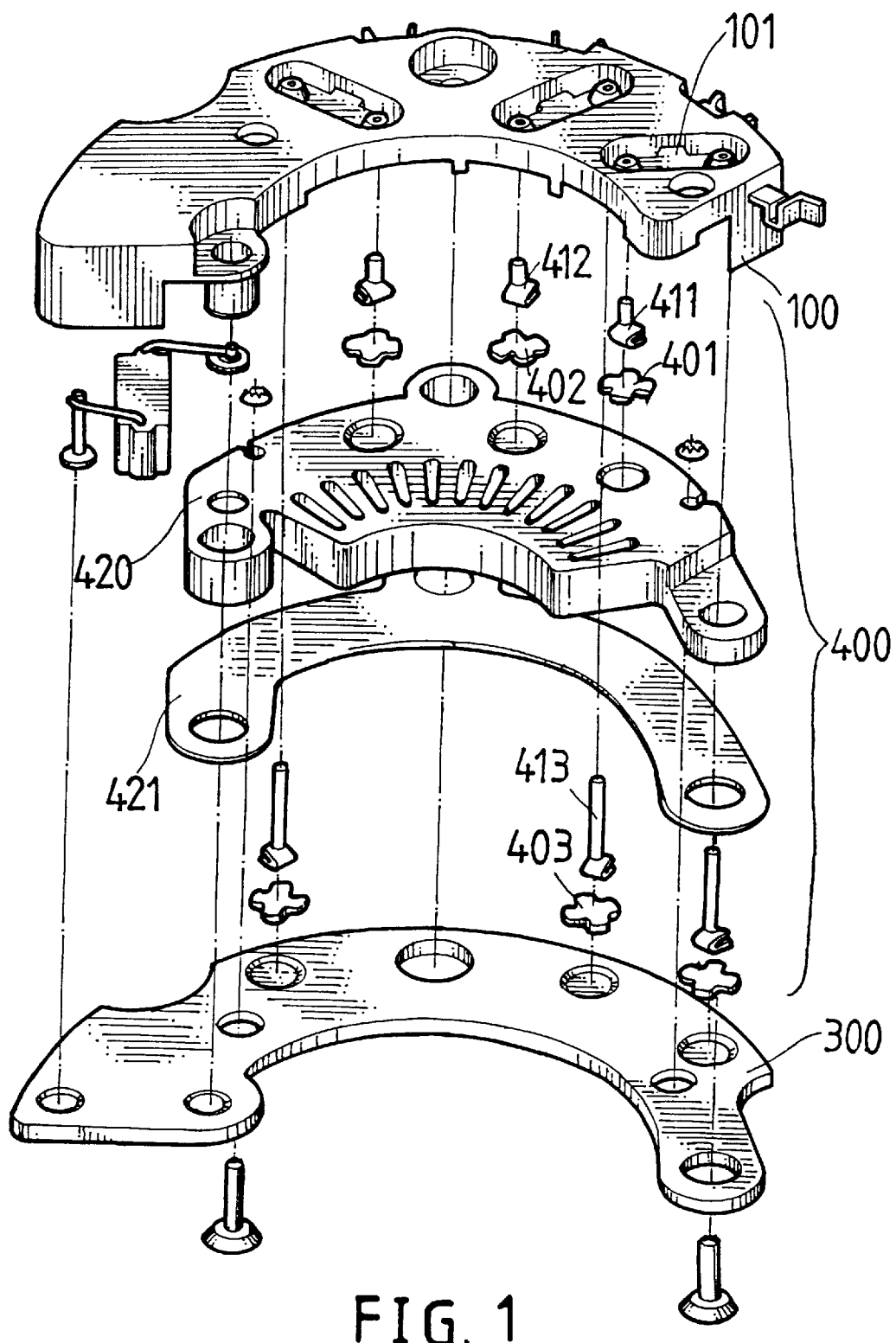
FIG. 1 is an elevational exploded view of a conventional heat dissipating structure for rectifiers of car alternators.

For the purpose of promoting an understanding of the principles of the invention, reference will now be made to the embodiment illustrated in the drawings. Specific language will be used to describe same. It will, nevertheless, be understood that no limitation of the scope of the invention is thereby intended, such alterations and further modifications in the illustrated device, and such further applications of the principles of the invention as illustrated herein being contemplated as would normally occur to one skilled in the art to which the invention relates.

Figure 2:
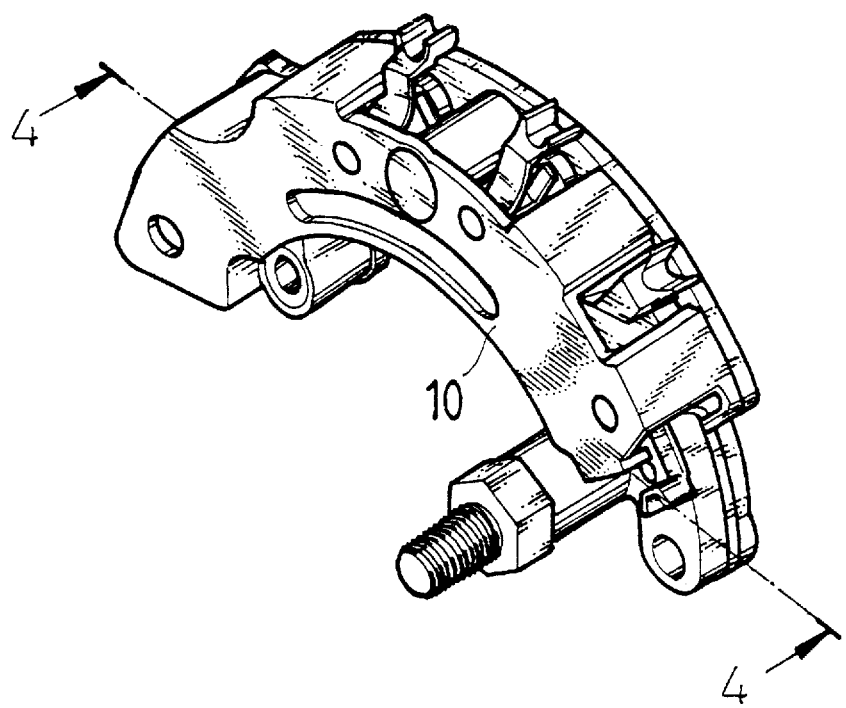
FIG. 2 is an elevational view of the improved heat dissipating structure for rectifiers of car alternators.
Figure 3:
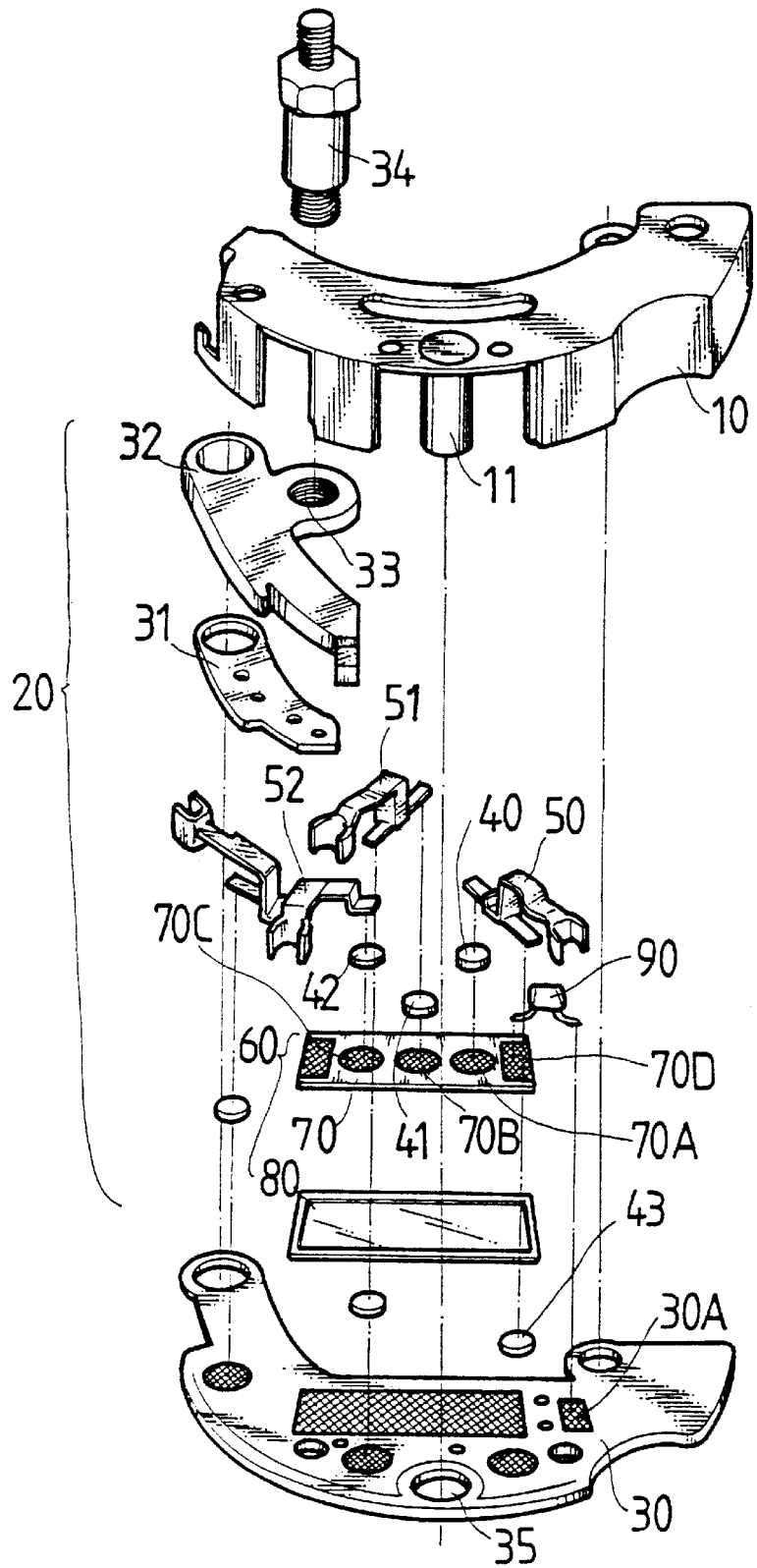
FIG. 3 is an elevational exploded view of the improved heat dissipating structure for rectifiers of car alternators.
Figure 4:
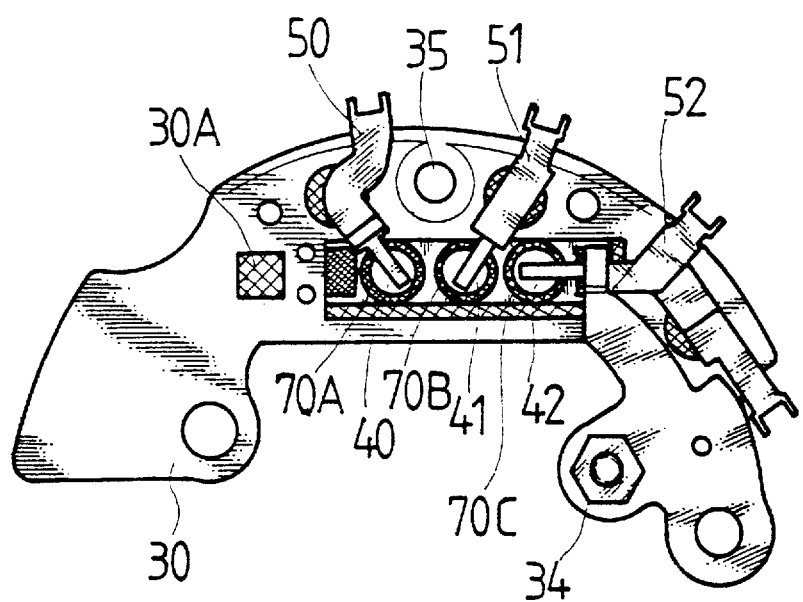
FIG. 4 is a sectional view taken along line 4—4 of FIG. 2.

With reference to FIGS. 2 and 3, the improved heat dissipating structure for rectifiers of car alternators of the present invention essentially comprises an upper cover 10 accommodating a rectifier assembly 20 disposed on a heat dissipating plate 30. The rectifier assembly 20 is comprised of a plurality of rectifying elements 40, 41, 42, 43, . . . , a capacitor 90, a plurality of terminals 50, 51, 53, and a heat conductive assembly 60 for receiving the rectifying elements. The rectifying elements are rectifying diodes. The rectifying elements are connected to the two pins of each corresponding terminal in pairs of two to form the rectifier circuit as shown in FIG. 4. The heat conductive assembly 60 on which the rectifying elements are joined to the terminals is comprised of a heat conductive plate 70 and a ceramic heat dissipating substrate 80. Several copper plated portions 70A, 70B, 70C are formed on the heat conductive plate 70, and the rectifying elements are soldered to the corresponding copper plated portions. The ceramic heat dissipating substrate 80 is disposed between the heat conductive plate 70 and the heat dissipating plate 30. Additionally, a copper plated portion 70D is formed at an edge of the heat conductive plate 70 to which a pin of the capacitor 90 may be soldered. The other pin of the capacitor 90 is soldered to a corresponding copper plated portion 30A on the heat dissipating plate 30. The capacitor 90 is therefore secured between the heat conductive plate 70 and the heat dissipating plate 30. A pad 31 is disposed at one end of that side of the heat dissipating plate 30 facing the bottom side of the upper cover 10. The pad 31 has an elongate terminal 32 disposed thereon. The elongate terminal 32 has a screw hole 33 for passage of a screw rod 34. The screw rod 34 extends through a hollow in the upper cover 10 for locking to an alternator (not shown). A through hole 35 is further provided at a suitable position of the heat dissipating plate 30. A post 11 projects from the bottom side of the upper cover 10 at a corresponding position for matching the through hole 35 of the heat dissipating plate 30. When the upper cover 10 and the heat dissipating plate 30 are coupled, the post 11 will insert into the through hole 35, and the rectifier assembly 20 is held between the upper cover 10 and the heat dissipating plate 30. In use, due to the excellent heat dissipating effects of the ceramic heat dissipating substrate 80, the high heat generated by the rectifying elements and the surrounding heat may be considerably absorbed. Because of its exceptionally good heat dissipating effects, the ceramic heat dissipating substrate 80 may be compactly made, so that the size and weight of the overall heat dissipating structure may be greatly reduced.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

I claim:

1. A heat dissipating structure for rectifiers of car alternators comprising:

an upper cover;

a rectifier assembly, disposed below said upper cover, and being comprised of a plurality of rectifying elements and terminals, and a heat conductive assembly for receiving said rectifying elements, said conductive assembly having a heat conductive plate to which said rectifying elements may be soldered, and a ceramic heat dissipating substrate; and a heat dissipating plate; wherein said rectifying elements have one side connected to corresponding terminals to form a rectifier circuit;

said rectifying elements have another side connected to said heat conductive assembly, which is in turn connected to said heat dissipating plate; and said ceramic heat dissipating substrate is disposed between said heat conductive plate and said heat dissipating plate.

2. The heat dissipating structure for rectifiers of car alternators as claimed in claim 1, wherein said rectifying elements are connected to a respective pair of pins of each of said terminals in pairs of two.

3. The heat dissipating structure for rectifiers of car alternators as claimed in claim 1, wherein said heat conductive plate has a plurality of copper plated portions formed thereon to which said rectifying elements may be soldered.

\* \* \* \* \*